United States Patent

Bentson et al.

Patent Number: 5,264,107
Date of Patent: Nov. 23, 1993

[54] PSEUDO-ELECTROLESS, FOLLOWED BY ELECTROLESS, METALLIZATION OF NICKEL ON METALLIC WIRES, AS FOR SEMICONDUCTOR CHIP-TO-CHIP INTERCONNECTIONS

[75] Inventors: Richard S. Bentson, Somerville; Jerry J. Rubin, Chatham, both of N.J.; Frank Stepniak, Minneapolis, Minn.

[73] Assignee: AT&T Bell Laboratories, Murray Hill, N.J.

[21] Appl. No.: 809,694

[22] Filed: Dec. 17, 1991

[51] Int. Cl.$^5$ ............................................. C23C 28/00
[52] U.S. Cl. ...................................... 205/86; 205/118; 205/123; 205/191; 205/916; 427/97; 427/305
[58] Field of Search ................... 205/118, 123, 85, 86, 205/191, 916; 427/96, 97, 98, 305

[56] References Cited

U.S. PATENT DOCUMENTS 4,770,751 9/1988 Kawagishi et al. ............... 204/30

OTHER PUBLICATIONS

F. A. Lowenheim, *Electroplating*, McGraw-Hill Book Company, New York, 1978, pp. 389–391, 410–415.
Adams, A. C. et al., "High Density Interconnect for Advanced VLSI Packaging", *Defect and Diffusion Forum*, Proceedings of the ASM Symposium, Cincinnati, Ohio, Oct. 11–16, 1987, pp. 129–136, vol. 59 (1988).

*Primary Examiner*—John Niebling
*Assistant Examiner*—William T. Leader
*Attorney, Agent, or Firm*—David I. Caplan

[57] ABSTRACT

A nickel plug (31) filling an aperture in an insulating layer (30), such as polyimide, separating two metallization levels of copper wires (28, 25) is formed by an electroless process in a plating bath (solution) containing ions of hypophosphite and of nickel. In preparation for this electroless process, the copper wires (28, 25) are first plated with a nickel layer (29) by a pseudo-electroless process-that is, a process in which the copper wires (28, 25) are located in contact with an underlying extended chromium layer (14) that is placed in electrical contact (including intimate physical contact) with an auxiliary metallic member (41) that contains nickel, while both the copper wires (28, 25), the chromium layer (14), and at least a portion of the external metallic layer (41) are immersed in a plating solution likewise containing ions of hypophosphite and of nickel.

29 Claims, 2 Drawing Sheets

PSEUDO-ELECTROLESS, FOLLOWED BY ELECTROLESS, METALLIZATION OF NICKEL ON METALLIC WIRES, AS FOR SEMICONDUCTOR CHIP-TO-CHIP INTERCONNECTIONS

TECHNICAL FIELD

This invention relates to electrical interconnections, and more particularly to methods of forming semiconductor chip-to-chip interconnections-also known as high, density interconnects for advanced VLSI (very large scale integration) packaging.

BACKGROUND OF THE INVENTION

Semiconductor VLSI chips can contain in excess of a million transistors, together with hundreds of I/O (input/output) pads. To each of the pads, one or more chip-to-chip metallic interconnections ("interconnects") are attached, whereby a VLSI package is formed. The package typically contains as many as eight or more of these thus interconnected semiconductor VLSI chips.

The above-mentioned (metallic) interconnects are typically copper strips ("lines" or "wires"), each of which runs along one of two or more metallization levels (horizontal planes), each level being separated from the next by a suitable insulating layer, such as a layer of polyimide. Wires that are located on two successive metallization levels are connected to one another through holes (apertures; "vias") in the insulating layer filled with a suitable metal. Each via thus has a height that is equal to the thickness of the insulating layer, typically in the approximate range between 5 and 10 $\mu$m, and the cross section of a via is typically 10 to 200 $\mu$m in diameter. Each of the wires on the top level typically is connected to one or more I/O pads of one or more chips, typically by means of a glob ("bump") of solder.

The paper entitled, "High Density Interconnect for Advanced VLSI Packaging" by A. C. Adams et al. published in *Diffusion Processes in High Technology Materials, Proceedings of the ASM Symposium*, pp. 129–136 (October 1987), describes a VLSI package in which the wires are made of copper, because of its desirably high electrical conductivity, and the insulating layer is polyimide because of its excellent dielectric and mechanical properties. Because the polyimide does not adhere well to copper, however, if a copper wire comes in direct physical contact with the polyimide, then undesirable delamination of the polyimide from the copper wire would occur, whereby the structure would be mechanically unreliable. Moreover, because of potential chemical interaction of copper with polyimide, if copper in either the wires or the vias would be in direct physical contact with the polyimide, then the insulating properties of the polyimide would be deteriorated. On the other hand, because nickel has good adherence properties with respect to, and is desirably non-interactive with, polyimide; therefore, the aforementioned paper teaches that the copper wires are to be coated with nickel, and the vias are to be filled also with nickel (to form nickel "plugs").

More specifically, to obtain such a structure, the nickel could be deposited into the apertures by two electroless steps—i.e., successive immersions in aqueous solutions ("plating baths") containing nickel ions, one such immersion before the polyimide layer has been formed, and the other such immersion after the polyimide layer has been formed and has been supplied with the apertures. The first immersion would coat the copper wires with nickel; the second immersion would thus produce the nickel plugs. However, we have found that the required compositions of the plating baths for the two immersions must be different. More specifically, a plating bath that is suitable for electroless plating the copper wires with nickel is not suitable for filling the vias with nickel (plugs), especially in view of the required height of each nickel plug to fill each via. Thus, the resulting electroless deposited nickel formed during the first immersion is necessarily dissimilar in composition to the nickel deposited during the second immersion, whereby the (second) nickel in the vias deposits poorly (if at all) on first nickel layer that coats the (top and side) surfaces of the copper; consequently, the subsequently formed nickel plugs undesirably do not reliably fill the vias. At the same time undesirably poor adhesion of copper to the polyimide tends to result, whereby moisture can undesirably migrate from the environment to the various levels and undesirably cause corrosion of the metallization.

Another approach is forming a thin nickel layer on copper by means of a quick ("flash") electroless process in a first plating bath, and using the resulting thin nickel layer as a foundation for a second, thick nickel layer deposited on this thin nickel layer by means of a second electroless process in a second plating bath having a composition that is different from that of the first bath, followed by forming the polyimide layer with its apertures filled with nickel plugs formed by means of an electroless process in a third plating bath having the same composition as that of the second bath. We have found that such a ("flash") electroless nickel layer also tends not to be a reliable foundation for the thick nickel layer and hence for the subsequent formation of the nickel plugs, again because of the required different composition of the two plating baths-one for the thin ("flash") nickel layer, and the other for the (overlying) thick nickel layer. That is, the thick nickel layer, as deposited on the thin ("flash") nickel layer, tends to be non-uniform in thickness, whereby at least some of the vias undesirably are not filled with metal and hence at least some of the desired electrical connections between successive metallization levels are undesirably nonexistent.

Moreover, we have found that the use of electroplating (battery-assisted plating) as a process for coating the copper wires with nickel tends to produce an electroplated layer (of nickel on copper) that has an undesirably nonuniform thickness. Also, electroplating cannot be used at all to form the nickel plugs because at the time these plugs are to be formed it is simply not feasible to electrically access all the copper wires.

Therefore, it would be desirable to have a method of plating nickel on copper (wires)—the nickel having properties that enable reliable electroless formation of nickel, for example, in an aperture in an overlying insulating layer.

SUMMARY OF THE INVENTION

The foregoing shortcomings in prior art are mitigated in accordance with the invention by an inventive method of plating nickel on a limited portion of a first patterned metallic layer located overlying a limited portion of a first insulating layer including the steps of:

(a) forming a second metallic layer comprising nickel on the first patterned metallic layer by immersing the first patterned metallic layer in an aqueous solution comprising nickel ions, the first patterned metallic layer being located in intimate physical contact with an underlying extended metal layer and the extended metal layer being in electrical contact with an auxiliary metal member comprising nickel at least a portion of which is immersed in the aqueous solution;

(b) removing the extended metallic layer except in regions underlying the first patterned metallic layer;

(c) forming a second insulating layer, overlying the patterned metallic layer and the first insulating layer, and having an operture overlying the limited portion of the first patterned metallic layer; and (d) forming a third metallic layer ("plug") comprising nickel on the second metallic layer by an electroless plating process, whereby the aperture in the second insulating layer is filled with nickel.

As used herein, the term "electrical contact" includes, but is not limited to, intimate (direct) physical contact of the surface of one metallic layer with the other.

In the above sequence of steps, step (a) is called a "pseudo-electroless" nickel plating process, since this step (a) does not involve any externally applied voltages or currents (as does electroplating) but it does require electrical contact with the auxiliary metal layer, which advantageously comprises nickel (in contradistinction to purely electroless plating, which does not require any contact with any auxiliary metal layer). It is believed that a "pseudo-electroless" nickel plating process involves two stages: an initial formation of an initial nickel layer by means of an automatically initiated and automatically terminated galvanic deposition, followed by an in situ formation of a further nickel layer by means of electroless deposition. However, it should be understood that the success of the invention does not depend upon the correctness of the foregoing belief.

Thus, the nickel of the third metallic layer ("plug") that has been plated in the aperture, using the pseudo-electroless deposited nickel layer as a foundation, can serve as a means for interconnecting the first metallic layer—serving as a power plane, as a (vertical) ground interconnect, or as one of the copper wires—to an overlying conductive layer (e.g., a wire, or a solder bump for connection to a VLSI chip) located on the top surface of the second insulating layer. In this way, wires on two successive levels of metallization can be interconnected.

Advantageously the wires comprise copper and the second insulating layer is polyimide.

The pseudo-electroless nickel layer can be formed from a bath having essentially the same composition as that of the bath from which the subsequently plated electroless nickel plugs are formed, and hence each nickel plug deposits very well and uniformly on the underlying pseudo-electroless nickel layer, because both the plug and the pseudo-electroless nickel layer are derived from the same nickel plating solution. At the same time, the pseudo-electroless nickel layer is reliably deposited directly onto the underlying copper wires.

Pseudo-electroless deposited nickel, as opposed to electroless deposited nickel, forms a reliable and complete coating on the top and side surfaces of the patterned copper layer, whereby a reliable seal is formed between the pseudo-electroless nickel layer and the polyimide layer, and thus unwanted impurity migration between metallization levels is prevented. Also, the pseudo-electroless nickel forms a good foundation for the subsequent (purely) electroless process of step (d), a step which cannot be performed either by a pseudo-electroless or by an electroplating process because of the earlier removing, during earlier step (b), of the extended metallic layer (except in regions underlying the first metallic layer)—step (b) thus resulting in a lack of electrical accessibility by an external electrical contact to the pseudo-electroless nickel layer.

Step (b) is required to prevent short circuits among the various wires formed by the first patterned metallic layer.

Only for the sake of clarity, none of the Figures is drawn to any scale.

DETAILED DESCRIPTION

Figure 1:
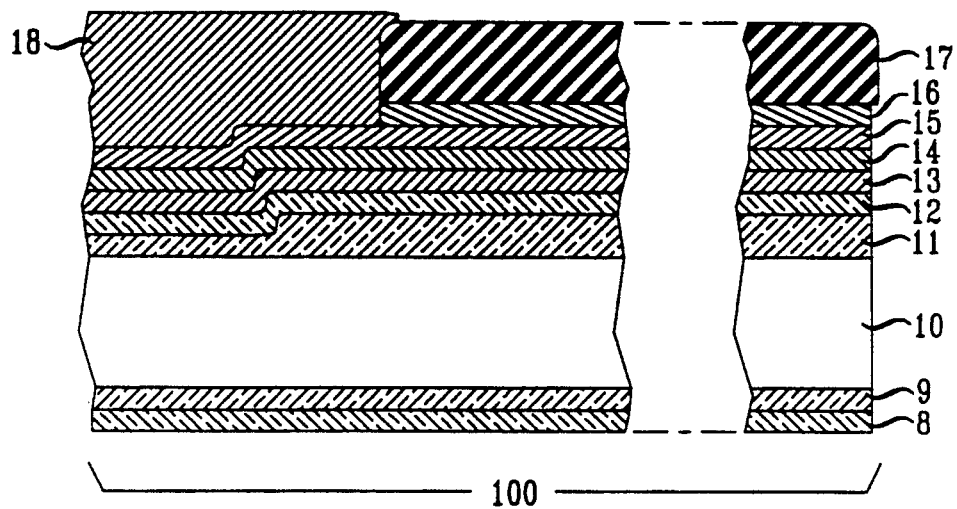
FIGS. 1–4 depict elevational side views in cross section of various stages in the fabrication of semiconductor chip-to-chip interconnections including the step of pseudo-electroless metallization followed by electroless metallization, in accordance with a specific embodiment of the invention.

In FIG. 1, structure 100 represents an early stage in the fabrication of semiconductor chip-to-chip interconnections. The structure 100 is formed by a silicon wafer 10 that is heavily doped, typically with boron, in order to provide high electrical conductivity. The bulk resistivity of the silicon wafer 10 typically is less than 0.001 ohm-cm.

Upon the bottom surface of the silicon wafer 10 is located a silicon dioxide layer 9 and a silicon nitride layer 8. The thickness of the silicon dioxide layer 9 typically is approximately equal to 0.05 $\mu$m, and the thickness of the silicon nitride layer 8 is approximately equal to 0.120 $\mu$m. The silicon dioxide layer 9 is formed simultaneously with the thin (0.05 $\mu$m) portions of the silicon dioxide layer 11, and the silicon nitride layer 8 is formed simultaneously with the silicon nitride layer 12. Ultimately, in the final structure, the silicon dioxide layer 9 and the silicon nitride layer 8 will be removed and be replaced by a metallic layer, such as copper, for providing a good ground contact for the silicon wafer 10.

Upon the top major surface of the silicon wafer 10 are located a silicon dioxide layer 11, a 0.120 $\mu$m thick silicon nitride layer 12 deposited by low pressure chemical vapor deposition, a 0.055 $\mu$m thick deposited titanium layer 13, a 0.065 $\mu$m thick deposited chromium layer 14, a 0.250 $\mu$m thick sputter-deposited copper layer 15, a 0.055 $\mu$m thick deposited and patterned titanium layer 16, a 2.5 $\mu$m thick patterned photoresist layer 17 having an aperture that was used for patterning by liquid etching on originally unpatterned titanium layer (not shown) to form the patterned titanium layer 16, and a patterned copper layer 18 filling the aperture in the patterned photoresist layer 17. Typically, the aperture in the patterned photoresist layer 17 was formed by means of exposing an initially uniformly thick spun-on resist layer to a patterning ultraviolet beam, followed by standard wet development of the photoresist layer.

The thickness of the silicon dioxide layer 11 is typically approximately equal to 1.0 $\mu$m except at areas underlying central portions of the patterned copper layer 18 where the thickness of the silicon dioxide layer 11 is approximately equal to 0.05 μm. The purpose of the thin oxide is to provide a desirably high capacitance between the copper layer 18, which will serve as a power plane, and the silicon wafer 10, which will be grounded.

In case the patterned copper layer 28 (FIGS. 3 and 4) to be formed from the patterned copper layer 18 is to serve as a signal line, then the underlying silicon dioxide layer is advantageously everywhere equal to approximately 1.0 μm. And in case it is to serve as part of a vertical ground connection running from the silicon wafer 10 to an overlying silicon integrated circuit chip, then the thickness of both the silicon dioxide layer 11 and the silicon nitride layer are zero, in order to enable proper electrical contact to ground. Advantageously the patterned copper layer 18 is formed by electroplating (of copper onto the copper layer 15) within the aperture of the patterned photoresist layer 17, after removing (not shown in FIG. 1) an edge region of the photoresist layer 17 to expose an edge region of the patterned titanium layer 16, to supply an electrode for the electroplating process.

Figure 3:
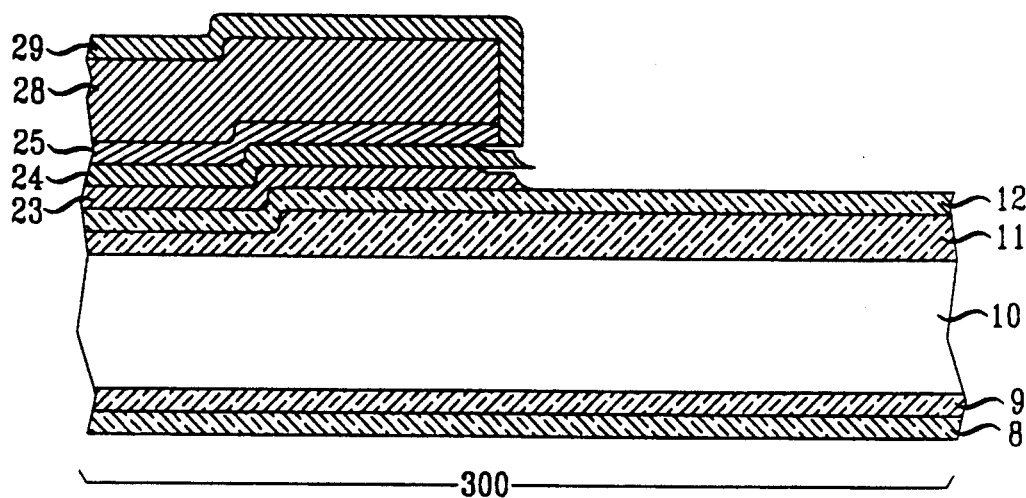
Figure 4:
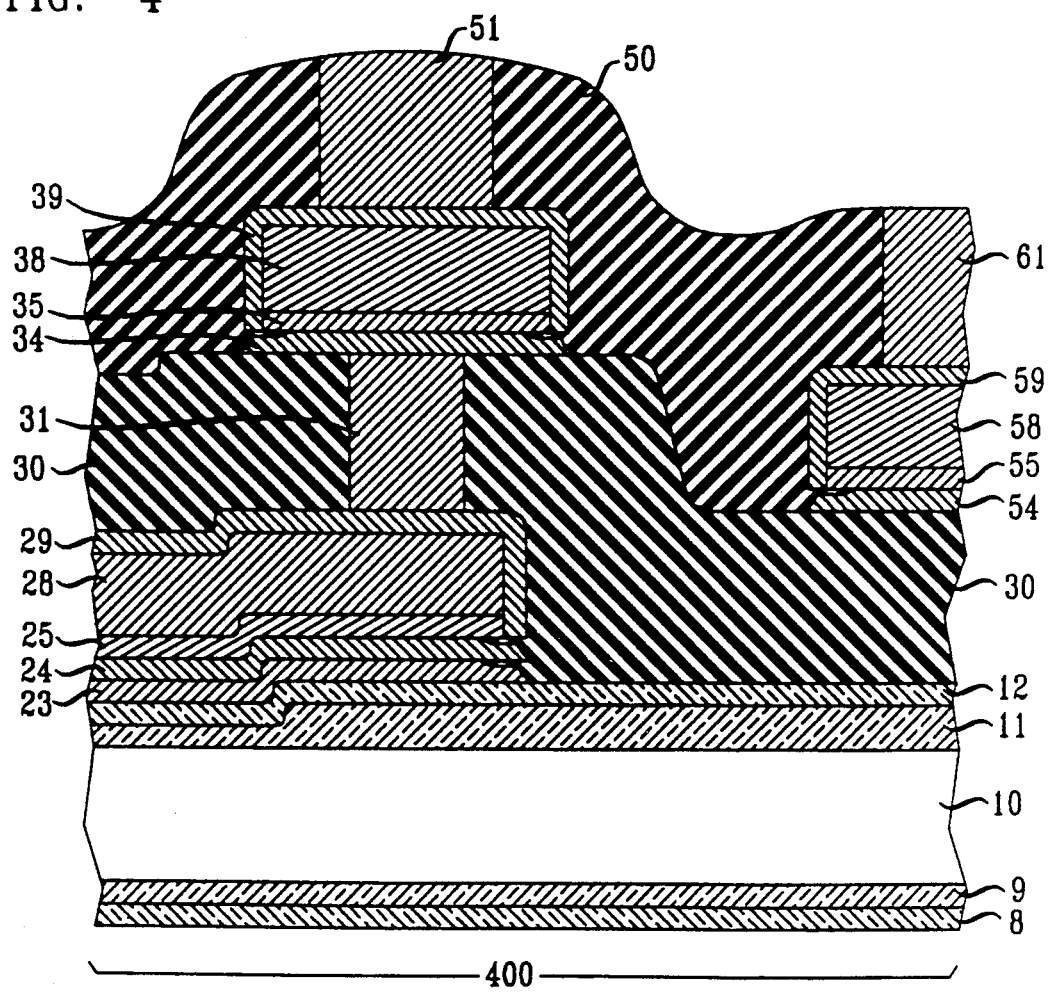

The sputter-deposited copper layer 15 is useful because electroplated copper would not adhere very well to the chromium layer 14, whereas (in vacuo) sputter-deposited copper does. On the other hand, the chromium layer 14 is useful for the pseudo-electroless deposition of the nickel layer 29 (FIG. 3) which, in turn, because of its high quality (uniform thickness) is useful as a good foundation for a subsequent electroless deposition of the nickel layer 31 (FIG. 4). The titanium layer 13 is useful because the chromium layer 14 does not adhere well to the underlying silicon nitride layer 12; the titanium layer 16 is useful because the photoresist layer 17 does not adhere well to the underlying copper layer 15. The patterning of the photoresist layer 17 is made to be such that the copper layer 18 is patterned in accordance with the desired routing of the resulting copper wire formed by the patterned copper layer 28 (FIG. 3).

Figure 2:
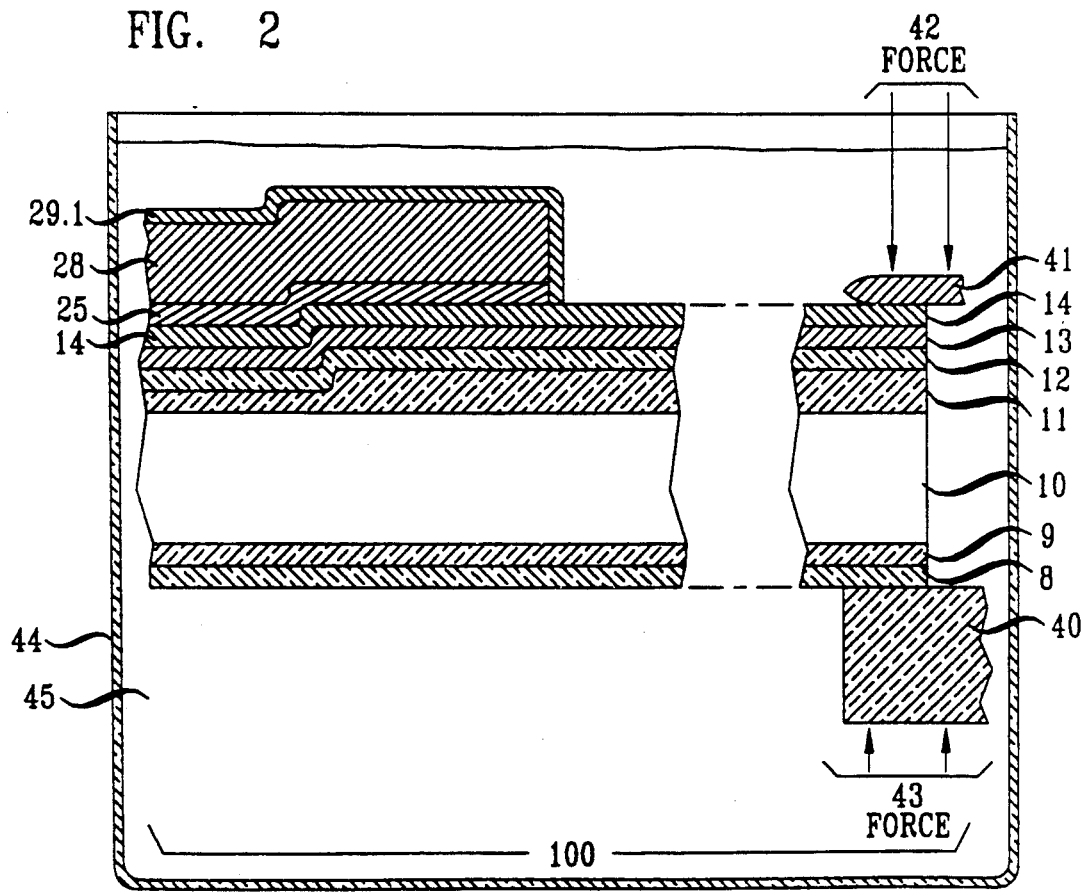

After the patterned copper layer 18 has been formed, the photoresist layer 17 is removed. Then the remainder of the titanium layer 16 is removed, as by liquid etching in aqueous HF. Next, the (relatively thin) copper layer 16 is removed, as by liquid etching in aqueous $H_2SO_4$ and $H_2O_2$, whereby the thickness of the patterned (relatively thick) copper layer 18 is reduced, but only by a relatively small amount in comparison to its original thickness. In this way, a patterned copper layer 28, 25 is formed (FIG. 2). This copper layer 28, 25 will serve as a power-carrying line ("power plane") that transports a voltage supply ($V_{DD}$) to an overlying silicon chip (not shown). Thus the power plane must be insulated from a ground connection (not shown) running vertically from the top surface of the silicon wafer 10 at a location (not shown) where the insulating layers 11 and 12 have been removed. Therefore, the patterned copper layer 28,25 must be patterned, i.e., cannot overlie the entire top surface of the wafer 10. Thus, the stage of fabrication represented by the structure 100 (FIG. 1) is attained.

This structure 100 is then immersed in a nickel plating bath 45, that is, an aqueous solution containing nickel ions and advantageously also hypophosphite ions. Other advantageous ingredients in the bath 45 include stabilizers, buffers, accelerators, complexors, and wetting agents. Components, together with instructions for making such a plating bath, are sold under the name "Nicklad-1000" by WITCO Company. The plating bath 45 is contained in a container 44. More specifically, the structure 100 while located in the bath 45, is mechanically squeezed between an auxiliary metallic layer 41, typically steel coated with nickel, and an insulating teflon layer 40. Typically, this auxiliary metal layer pair 41 is part of a cassette that holds one or more such structures 100 firmly in place.

During the immersion, nickel tends to plate onto the external metal layer 41 as well as onto exposed surfaces of the copper layer 28,25. Advantageously, opposing forces 42 and 43, applied to the auxiliary metallic layer 41 and the insulating layer 40, respectively, maintain the top surface of the extended chromium layer 14 in intimate (direct) physical contact with the bottom surface of the (nickel-coated) auxiliary metallic layer 41. In this way, a patterned pseudo-electroless nickel layer 29.1 begins to form on the exposed top and side surfaces of the copper layer 28,25, whereby the stage of fabrication represented by the structure 100 (FIG. 2) is attained. At the same time, no nickel will deposit on the chromium layer 14 because of lack of affinity, as well as because of a protective oxide passivation layer that tends to form on the surface of the chromiun layer 14. After a sufficient amount of time has elapsed, a desired thickness of typically about 0.50 μm of pseudo-electroless nickel is thus deposited, whereby the desired patterned pseudo-electroless nickel layer 29 (FIG. 3) is thus formed. This pseudo-electroless layer 29 forms a desirably uniformly thick coating of nickel on the top and side surfaces of the patterned copper layer 28.

Alternatively, the function of the auxiliary metallic layer 41 (as an electrode) can be served by a nickel layer that has been formed (prior to the immersion of the structure 100 in the bath 45) by means of depositing nickel on an exposed portion of the surface of the chromium layer 14, i.e., on a portion of the chromium layer external to the patterned copper layer 28,25.

Next, the entire thickness of the chromium layer 14 is removed (as by immersion in an aqueous solution of $KMnO_4$ and NaOH) except for portions protected by the overlying patterned copper layer 28. Then the titanium layer 13 is wet etched, as by an aqueous solution of HF, also except for portions underlying the copper layer 28. In this way, underlying the patterned copper layer 28, a patterned chromium layer 24 overlying a patterned titanium layer 23 (FIG. 3) is formed, and the stage of fabrication represented by the structure 300 is attained.

Next, the top surface of the structure 300 is coated with a polyimide layer 30 (FIG. 4) that has a thickness of typically about 10 μm and has an aperture overlying a limited portion of the top surface of the pseudo-electroless nickel layer 29. This limited portion extends into the plane of the drawing (FIG. 4) only so far as is desired for a via between the first and second level metallizations. Viewed from the top, the via is typically the area of a circle having a diameter in the approximate range of between 30 and 100 μm. The structure is then immersed in a (electroless) nickel plating bath—which advantageously can be the same as the bath 45 that was previously used for forming the pseudo-electroless nickel layer 29—whereby an electroless nickel plug 31 is formed to fill the aperture in the polyimide layer.

Next, a patterned chromium layer 34, 54 (FIG. 4), patterned copper layers 38, 35, and 58, 55, and patterned pseudo-electroless nickel layers 39, 59 are formed in the same manner as the patterned chromium layer 24, the patterned copper layer 28, 25, and the patterned pseudo-electroless layer 29 were formed. No titanium layer is formed (as the counterpart of the titanium layer 13) between the top surface of the polyimide layer 30 and the patterned chromium layer 34, 54, because titanium is not needed for good adherence of the patterned chromium layer 34, 54 to the polyimide layer 30; on the contrary, titanium would cause its own adherence problems with respect to the polyimide layer 30. On the other hand, a patterned titanium layer—the counterpart of the patterned titanium layer 16—is indeed formed on the top surface of the patterned copper layer 35, 55 before patterning, for the same reasons as the patterned titanium layer 16 was needed. Then, after forming another polyimide layer 50 with apertures overlying the patterned copper layer 38, 58, electroless nickel plugs 51 and 61 are formed in these apertures in the same manner as the electroless nickel plug 31 was formed.

Thus the stage of fabrication represented by the structure 400 is attained in which the electroless nickel plug 51 serves as a vertical connection for power from the second level of metallization—viz., the patterned copper layer 38—to the third level of metallization (not shown). Thus, the vertically-running electrical connection formed by the nickel plug 31, the chromium layer 34, the copper layers 38 and 35, the (pseudo-electroless) nickel layer 39 and the (electroless) nickel plug 51 together form a part of a desired electrical connection from the power line 28 to an overlying VLSI chip (not shown). The electroless nickel plug 61 serves as a vertical connection for signal from the second level of metallization—viz., the patterned copper layer 58.

The patterned copper layers 28, 38, and 58 will run horizontally, i.e., on a fixed metallization level, in paths consistent with the routing desired for that level. In this way, in the scheme exemplified by the structure 400 these patterned copper layers serve as the desired copper power planes (e.g., 28), copper plugs (e.g., 38) or copper signal wires (e:g., 58) on the various metallization levels, as the case may be.

Although the invention has been described in detail with respect to a specific embodiment various modifications can be made without departing from the scope of the invention. Instead of copper wires, aluminum, gold, or silver wires can be used; and the pseudo-electroless, followed by electroless, nickel can be plated on them for connecting wires located on one level of metallization to wires located on another level. Instead of chromium, other metals such as tungsten, molybdenum, tantalum, or other refractory metals that form dense passivating (protective oxide) layers can be used for the extended metallic layer 14—and thus for the layers 24, 34, and 54. Also, instead of nickel, the external metallic layer 41 can be coated with such other metals such as gold, platinum, palladium, or zinc.

Moreover, during an initial phase of the formation of the nickel layer 29 (as well as the nickel layers 39 and 59—i.e., any of the pseudo-electroless layers), the deposition of nickel can be battery-assisted (electroplated) in the aforementioned bath used for the pseudo-electroless nickel deposition. After this battery-assisted process has resulted in the formation of a nickel layer that everywhere coats the copper wires (to a thickness of nickel advantageously in the approximate range of between 0.07 and 0.10 μm, for the sake of uniformity of thickness), the battery is removed (the external electric circuit is broken) and the pseudo-electroless nickel plating process is implemented to complete the thickness (typically approximately 0.5 μm) of the nickel layer 29: a purely electroplated nickel layer having the thickness desired for the nickel layer 29 tends to have an undesirably non-uniform thickness.

Thus, the nickel plating process for forming the nickel layer 29 can have an initial electroplating phase whose time duration (as can be determined by experiment) is a specified fraction of the entire deposition time of the nickel layer 29. During the battery-assisted phase, the positive pole of the battery (or other d-c source) is connected to a wire or electrode that is dipped in the plating bath, while the negative pole of the battery is connected directly to the extended chromium layer 14 or to the auxiliary metallic layer 41 (and hence, indirectly, is electrically coupled to the chromium layer 14). Conveniently, the subsequent pseudo-electroless process (i.e., the process which is implemented after completion of the nickel deposition by means of the initial electroplating) can be implemented by disconnecting the battery (or other d-c source) and connecting (shorting) together the two wires (that were needed for connections to the battery) emerging from the plating bath. Thus the term "pseudo-electroless plating" includes the situation (FIG. 2) in which the extended chromium layer 14 is not in direct physical contact with an external nickel layer but is in electrical contact with it through a wire that the chromium layer 14 touches. The foregoing technique, involving an initial phase of electroplating followed by a final phase of pseudo-electroless plating to form the nickel layer 29, is useful in cases where the semiconductor wafer 10 is not in any direct physical contact with a conductive portion (if any) of the cassette or other holding means that keeps the wafer in place in the plating bath. Advantageously, the portion of the thickness of the nickel layer 29 thus formed during the final phase is at least one-half that formed during the initial phase (of electroplating).

We claim:

1. A method of plating nickel on a limited portion of a first patterned metallic layer located overlying a limited portion of a first insulating layer including the steps of:

(a) forming a second metallic layer comprising nickel on the first patterned metallic layer by immersing the first patterned metallic layer in an aqueous solution comprising nickel ions, the first patterned metallic layer being located in intimate physical contact with an underlying extended metallic layer, and the extended metal layer being in electrical contact with an auxiliary metallic member comprising nickel at least a portion of which is immersed in the aqueous solution;

(b) removing the extended metallic layer except in regions underlying the first patterned metallic layer;

(c) forming a second insulating layer, overlying the first patterned metallic layer and the first insulating layer, and having an aperture overlying the limited portion of the first patterned metallic layer; and (d) forming a third metallic layer comprising nickel on the second metallic layer by an electroless plating process, whereby the aperture in the second insulating layer is filled with nickel.

2. The method of claim 1 in which the first patterned metallic layer comprises copper.

3. The method of claim 2 in which the underlying extended metallic layer comprises chromium.

4. The method of claim 1, 2 or 3 in which the aqueous solution contains hypophosphite ions.

5. The method of claim 2 in which the second insulating layer comprises polyimide.

6. The method of claim 1 in which during step (a) no external voltage or current is applied to the extended metallic layer or to the auxiliary metallic member during the formation of at least one-half of the thickness of the second metallic layer.

7. The method of claim 1 in which during step (a) no external voltage or current is applied to the extended metallic layer or to the auxiliary metallic member during the formation of any of the thickness of the second metallic layer.

8. A method of forming a metallic plug (31) comprising nickel, located in an aperture in a first insulating layer (30) at the bottom of which is located a patterned second metallic layer (28, 25) overlying a limited portion of a second insulating layer (12, 11), comprising the steps of:
 (a) forming a first metallic layer (14, 13) comprising a first metal on the surface of a body;
 (b) forming the patterned second metallic layer (28, 25) comprising a second metal different from the first metal on a limited portion of the surface of the first metallic layer (14, 13);
 (c) immersing the first (14) and second (28, 25) metallic layers in a first aqueous solution (45) containing ions of nickel and of hypophosphite while the first metallic layer (14, 13), but not the second metallic layer (28,25), is placed in direct physical contact with a metallic member (41) comprising nickel, at least a portion of the metallic member being immersed in the aqueous solution (45), whereby a third metallic layer (29) comprising nickel is plated on the second metallic layer (28, 25) while essentially no nickel is plated on the first metallic layer (14, 13);
 (d) removing the first metallic layer (14, 13) except in a region underlying the second metallic layer (28, 25), whereby a patterned first metallic layer (24, 23) is formed;
 (e) forming the first insulating layer (30) with the aperture therein located overlying the third metallic layer (29); and
 (f) immersing the aperture in a second aqueous solution containing ions of nickel and of hypophosphite, whereby the plug (31) is formed by an electroless process.

9. The method of claim 8 in which the first metallic layer (14,13) comprises chromium.

10. The method of claim 9 in which the second metallic layer (28,25) comprises copper.

11. The method of claim 8 in which the second metallic layer (28, 25) comprises copper.

12. The method of claim 9, 10, or 11 in which the first insulating layer (30) comprises polyimide.

13. The method of claim 8 in which during step (c) no external electrical voltage or current source is applied to the first metallic layer (14, 13) or to the metallic member (41) during the plating of at least one-half the thickness of the third metallic layer (29).

14. The method of claim 8 in which during step (c) no external electrical voltage or current source is applied to the first metallic layer (14, 13) or to the metallic member (41) during the plating of any of the thickness of the third metallic layer (29).

15. A method of forming a first nickel layer (31) overlying a first limited portion of a top major surface of a second metallic layer (28, 25), the second metallic layer (28, 25) overlying a second limited portion of a top surface of a first insulating layer (12), comprising the steps of:
 (a) forming a third metallic layer (14) overlying the top surface of the insulating layer (12);
 (b) forming the second metallic layer (28, 25) directly physically contacting the third metallic layer (14) and overlying the second limited portion of the top surface of the first insulating layer (12);
 (c) immersing the second, and third metallic layers in a first aqueous solution (45) containing ions of nickel and of hypophosphite while the third metallic layer (14), but not the second metallic layer (28, 25), is placed in intimate physical contact with a metallic member (41) comprising nickel for a predetermined amount of time, at least a portion of the metallic member (41) being immersed in the aqueous solution (45), whereby a fourth metallic layer (29) comprising nickel is plated on the second metallic layer (28, 25) while essentially no nickel is plated on the third metallic layer (14);
 (d) removing the third metallic layer (14) from areas overlying the first insulating layer (12) that do not underlie the second metallic layer (28, 25);
 (e) forming a second insulating layer (30) on the top surface of the first insulating layer (12) and on the exposed surfaces of the fourth metallic layer (29).
 (f) forming an aperture in the second insulating layer (30), whereby the top surface of the fourth metallic layer (29) is exposed in a region thereof overlying the first limited portion of the top surface of the second metallic layer (28, 25); and
 (g) immersing at least the second insulating layer (30) and the aperture in a second aqueous solution that contains ions of nickel and of hypophosphite, whereby the first nickel layer (31) forms in the aperture.

16. The method of claim 15 in which the second metallic layer (28, 25) comprises copper.

17. The method of claim 16 in which the third metallic layer (14) comprises chromium.

18. The method of claim 15 in which during any part of step (c) no external electrical voltage or current is applied to the third (14) metallic layer or to the metallic member (41).

19. The method of claim 15, 16, 17, or 18 in which the second metallic layer (28, 25) is formed by sputter-depositing a copper layer (15) on the top surface of the third metallic layer (14), followed by the steps of:
 (a) forming a fifth metallic layer (16) on the top surface of the copper layer (15);
 (b) forming an auxiliary insulating layer on the top surface of the fifth metallic layer, and forming an aperture in the auxiliary insulating layer, to form a patterned auxiliary insulating layer (17);
 (c) removing the portion of the fifth metallic layer (16) located in the aperture in the patterned auxiliary insulating layer (17), whereby a patterned fifth metallic layer (16) is formed and whereby the portion of the copper layer (15) located underlying the aperture in the patterned auxiliary insulating layer (17) is exposed;
 (d) electroplating a metal layer comprising copper into the aperture in the patterned auxiliary insulating layer (17), to form a copper layer (18) contacting the portion of the copper layer (15) located at the bottom of the aperture in the patterned auxiliary insulating layer (17);

(e) removing the patterned auxiliary insulating layer (17);

(f) removing the patterned fifth metallic layer (16); and (g) removing the complementary portion of the copper layer (15), which was not located underlying the aperture in the patterned auxiliary insulating layer (17), whereby the thickness of the copper layer (18) is reduced and whereby the second metallic layer (28, 25) is formed.

20. The method of claim 15 in which the third metallic layer (14) comprises chromium.

21. The method of claim 15 in which the patterned fifth layer (16) comprises titanium and the second metallic layer (28, 25) comprises copper.

22. The method of claim 15 or 16 in which a positive pole of a d-c source electrical is connected to the third metallic layer (14) or to the metallic member (41) for a specified fraction of the specified amount of time, whereby less than one-half the thickness of the fifth metallic layer (29) is plated during the specified fraction of the specified amount of time.

23. A method of forming a multilevel metallization assembly for interconnecting a plurality of integrated circuit chips comprising the steps of:

(a) forming a patterned metallic layer (28, 25) located overlying and electrically contacting an extended metallic layer (14) located overlying an extended insulating layer (11, 12);

(b) immersing the patterned metallic layer (28, 25) and the extended metallic layer (14) in a first aqueous solution comprising nickel ions while the extended metallic layer (14) intimately physically contacts an auxiliary metallic member (41) comprising nickel, at least a portion of the external metallic layer being immersed in the aqueous solution (45), whereby a patterned nickel layer (29) forms on the surface of the patterned metallic layer (28, 25);

(c) removing the extended metallic layer (14) except in regions underlying the patterned metallic layer (28, 25);

(d) forming a patterned insulating layer (30), located overlying the patterned metallic layer (28, 25) and the extended insulating layer (11, 12), and having an aperture overlying a limited portion of the patterned metallic layer (28, 25);

(e) immersing the aperture in a second aqueous solution comprising nickel ions, whereby the aperture is filled with nickel by an electroless plating process.

24. The method of claim 23 in which the patterned layer (28, 25) comprises copper.

25. The method of claim 24 in which the extended metallic layer (14) comprises chromium.

26. The method of claim 25 in which the first aqueous solution comprises hypophosphite ions.

27. The method of claim 24, 25, or 26 in which the patterned insulating layer (30) comprises polyimide.

28. The method of claim 23, 24, 25, or 26 in which during step (b) no electrical current or voltage source is connected either to the extended metallic layer (14) or to the auxiliary metallic member (41) during the formation of at least one-half the thickness of the patterned nickel layer (29).

29. The method of claim 23, 24, 25, or 26 in which during step (b) no electrical current or voltage source is connected either to the extended metallic layer (14) or to the auxiliary metallic member (41) during the formation of any of the thickness of the patterned nickel layer (29).

* * * * *